United States Patent
Cheng et al.

(10) Patent No.: US 11,444,083 B2
(45) Date of Patent: Sep. 13, 2022

(54) FABRICATION OF FIN FIELD EFFECT TRANSISTORS UTILIZING DIFFERENT FIN CHANNEL MATERIALS WHILE MAINTAINING CONSISTENT FIN WIDTHS

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/866,150

(22) Filed: May 4, 2020

(65) Prior Publication Data

US 2020/0266195 A1    Aug. 20, 2020

Related U.S. Application Data

(62) Division of application No. 15/443,644, filed on Feb. 27, 2017, now Pat. No. 10,707,208.

(51) Int. Cl.

| | |
|---|---|
| *H01L 27/092* | (2006.01) |
| *H01L 29/66* | (2006.01) |
| *H01L 29/10* | (2006.01) |
| *H01L 27/088* | (2006.01) |
| *H01L 21/8238* | (2006.01) |

(Continued)

(52) U.S. Cl.
CPC ............ *H01L 27/0924* (2013.01); *H01L 21/823431* (2013.01); *H01L 21/823807* (2013.01); *H01L 21/823821* (2013.01); *H01L 27/0886* (2013.01); *H01L 29/1054* (2013.01); *H01L 29/1083* (2013.01); *H01L 29/66795* (2013.01); *H01L 29/66818* (2013.01); *H01L 29/161* (2013.01)

(58) Field of Classification Search
None
See application file for complete search history.

(56) References Cited

U.S. PATENT DOCUMENTS

| | | |
|---|---|---|
| 8,048,723 B2 | 11/2011 | Chang et al. |
| 8,703,565 B2 | 4/2014 | Chang et al. |
| 9,093,326 B2 | 7/2015 | Cheng et al. |

(Continued)

OTHER PUBLICATIONS

List of IBM Patents or Patent Applications Treated as Related dated May 4, 2020, 2 pages.

*Primary Examiner* — Erik Kielin
(74) *Attorney, Agent, or Firm* — Tutunjian & Bitetto, P.C.; Randall Bluestone

(57) ABSTRACT

A method of forming vertical fins on a substrate at the same time, the method including, forming a mask segment on a first region of the substrate while exposing the surface of a second region of the substrate, removing a portion of the substrate in the second region to form a recess, forming a fin layer in the recess, where the fin layer has a different material composition than the substrate, and forming at least one vertical fin on the first region of the substrate and at least one vertical fin on the second region of the substrate, where the vertical fin on the second region of the substrate includes a fin layer pillar formed from the fin layer and a substrate pillar.

18 Claims, 11 Drawing Sheets

(51) Int. Cl.
    *H01L 21/8234*    (2006.01)
    *H01L 29/161*     (2006.01)

(56)  References Cited

U.S. PATENT DOCUMENTS

| | | |
|---|---|---|
| 9,257,556 B2 | 2/2016 | Xu et al. |
| 9,276,013 B1 | 3/2016 | Doris et al. |
| 9,299,809 B2 | 3/2016 | Brunco |
| 9,324,843 B2 | 4/2016 | Balakrishnan et al. |
| 2008/0102570 A1* | 5/2008 | Fischer ............. H01L 29/66818 438/157 |
| 2011/0108920 A1* | 5/2011 | Basker ................ H01L 29/1054 257/E29.151 |
| 2011/0147811 A1* | 6/2011 | Kavalieros .......... H01L 29/7851 257/E21.409 |
| 2013/0224936 A1* | 8/2013 | Lee ................. H01L 21/823431 438/492 |
| 2013/0309838 A1* | 11/2013 | Wei ................. H01L 21/823821 438/424 |
| 2014/0097518 A1* | 4/2014 | Cheng ............... H01L 29/66795 257/618 |
| 2015/0228653 A1* | 8/2015 | Cheng ............... H01L 29/66795 257/369 |
| 2016/0027775 A1 | 1/2016 | Akarvardar et al. |
| 2016/0111338 A1 | 4/2016 | Loubet et al. |
| 2016/0181095 A1 | 6/2016 | Cheng et al. |
| 2017/0162447 A1* | 6/2017 | Glass ................ H01L 29/66545 |
| 2017/0213912 A1* | 7/2017 | Lin .................... H01L 29/7851 |
| 2017/0358680 A1* | 12/2017 | Jeong ................. H01L 29/7854 |
| 2018/0122916 A1* | 5/2018 | Fang ................ H01L 21/02178 |

\* cited by examiner

FABRICATION OF FIN FIELD EFFECT TRANSISTORS UTILIZING DIFFERENT FIN CHANNEL MATERIALS WHILE MAINTAINING CONSISTENT FIN WIDTHS

BACKGROUND

Technical Field

The present invention generally relates to formation of multiple vertical fins, where neighboring fins have different material compositions, and more particularly to fabricating fin field effect transistors (FinFETs) having fin channels with different material compositions, while avoiding disparities in channel width due to material related processing characteristics.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin Si, commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method of forming vertical fins on a substrate at the same time, the method including, forming a mask segment on a first region of the substrate while exposing the surface of a second region of the substrate, removing a portion of the substrate in the second region to form a recess, forming a fin layer in the recess, where the fin layer has a different material composition than the substrate, and forming at least one vertical fin on the first region of the substrate and at least one vertical fin on the second region of the substrate, where the vertical fin on the second region of the substrate includes a fin layer pillar formed from the fin layer and a substrate pillar is provided.

In accordance with another embodiment of the present invention, a method of forming vertical fins on a substrate at the same time, the method including, forming a recess in a substrate, where the recess defines a second region of the substrate, forming a fin layer in the recess, where the fin layer has a different material composition than the substrate, forming at least one vertical fin on the second region of the substrate, where the vertical fin on the second region of the substrate includes a fin layer pillar formed from the fin layer, and forming at least one vertical fin on a first region of the substrate adjacent to the fin layer, forming a filler layer on a lower portion of the at least one vertical fin on the first region of the substrate and the at least one vertical fin on the second region of the substrate, where at least a portion of the fin layer pillar is exposed above the filler layer, and removing a portion of the at least one vertical fin on the first region of the substrate to form a fin core, and removing a portion of the at least one vertical fin on the second region of the substrate to form a pillar core is provided.

In accordance with yet another embodiment of the present invention, a semiconductor device with vertical fins made of different materials, including, one or more vertical fins formed on a first region of a substrate, wherein each of the one or more vertical fins formed on a first region of a substrate includes a fin core made of a same material as the substrate, and one or more vertical fins formed on a second region of the substrate, where the second region of the substrate is adjacent to the first region of the substrate, and wherein each of the one or more vertical fins formed on the second region of the substrate includes a pillar core and a flared pillar section made of a different material than the one or more vertical fins formed on a first region of a substrate is provided.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
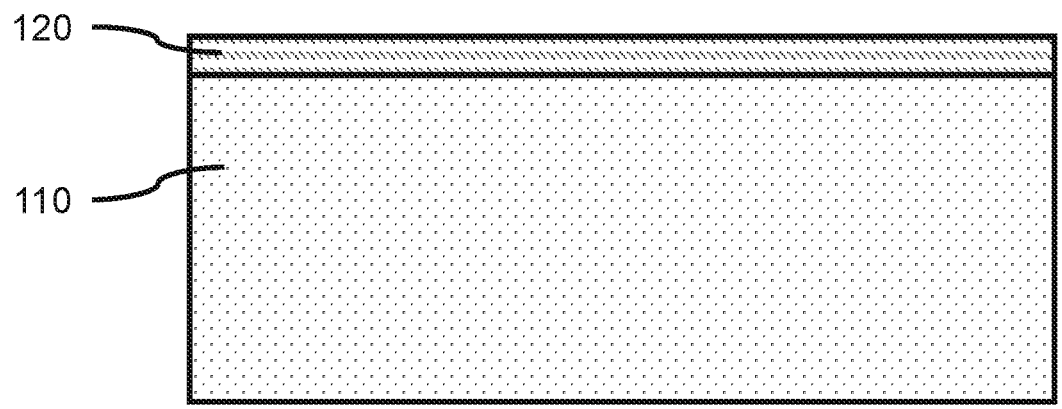
FIG. 1 is a cross-sectional side view showing a masking layer on a substrate, in accordance with an embodiment of the present invention.

Principles and embodiments of the present invention relate generally to forming a set of vertical fins on a substrate, where the vertical fins of a first subset include a first material, and the vertical fins of a second subset include a second material different from the first material, such that the vertical fins may experience different responses to processing conditions. Different channel materials are desired for nFETs and pFETs so that the performances of the nFETs and pFETs can be altered and improved independently. With ever decreasing device dimensions, forming transistors from different materials becomes even more difficult. The formation of fin field effect transistors (FinFETs) with critical dimensions (i.e., line width, fin width) at or below 10 nanometers (nm) can involve utilizing different materials to accomplish the fabrication of device features in that size range. A specific challenge, however, is forming an nFET and a pFET from different materials with substantially the same fin width.

Principles and embodiments of the present invention also relates generally to adjusting the composition of the vertical fins of a second subset after processing the full set of vertical fins on the substrate, where the composition of a compound semiconductor can be adjusted by preferentially reacting one of the semiconductor material constituents. For example, a silicon-germanium (SiGe) fin can undergo a preferential oxidation of the silicon (Si) constituent to consume a portion of the fin material, while increasing the germanium (Ge) concentration in the remaining fin material.

Principles and embodiments of the present invention also relate generally to processing a combination of vertical fins on a substrate that have different compositions resulting in different etch rates, where one vertical fin may be preferentially etched due to its material composition relative to other vertical fins on a neighboring portion of the same substrate. Different vertical fin widths are undesired due to the resulting differences in the devices' electrical properties. For example, SiGe vertical fins can be 2-3 nm narrower than Si vertical fins formed on the same substrate by the end of fin processing due to differences in material behavior under the same processing conditions.

While additional processing steps can be introduced to compensate for these differences, the additional steps increase both time and cost of fabrication compared to forming vertical fins having different materials on a substrate at the same time. Additional processing steps can also increase device failure and waste due to the added complexity of the overall fabrication process. Developing processing approaches that overcome or even capitalize on such processing differences is therefore desired.

Principles and embodiments of the present invention relate generally to forming Si fins and SiGe fins with comparable fin widths, where the starting material compositions can be altered to compensate for the differences in the composition's response to the same processing conditions. For example, instead of fabricating a SiGe fin from a material starting with the desired final Ge concentration (e.g., 20% Ge), a lower Ge concentration for the SiGe fin material is initially used (e.g., 10% Ge), so that the Si and SiGe (10% Ge, $Si_{0.9}Ge_{0.1}$) can be processed with minimal fin width difference. Wider vertical fins can be fabricated by the earlier fin fabrication processes, and a thinning process used to achieve two results at the same time: (1) adjusting the fin width to a final predetermined size; (2) increasing the Ge % in the SiGe fins. In this manner, a plurality of vertical fins having essentially the same fin width can be formed from materials having two different compositions on the same substrate without additional masking and stripping processes. There are also difficulties in separately patterning different fin widths on the same substrate.

Exemplary applications/uses to which the present invention can be applied include, but are not limited to: fabrication of Complementary metal-oxide-semiconductor (CMOS) devices for logic circuits (e.g., NAND, NOR, XOR, etc.), high speed memory (e.g., SRAM), and application specific integrated circuits (ASICs).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional side view of a masking layer on a substrate is shown, in accordance with an embodiment of the present invention.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, Si:C, or SiGe. The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides.

In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a masking layer 120 can be formed on at least a portion of a surface of a substrate 110. In various embodiments, the masking layer 120 can be formed on the substrate surface by CVD, LPCVD or a spin-on method, where the masking layer 120 can be blanket deposited on the substrate.

In one or more embodiments, the masking layer 120 can be hardmask, for example, silicon nitride (SiN), which can be deposited by CVD.

Figure 2:
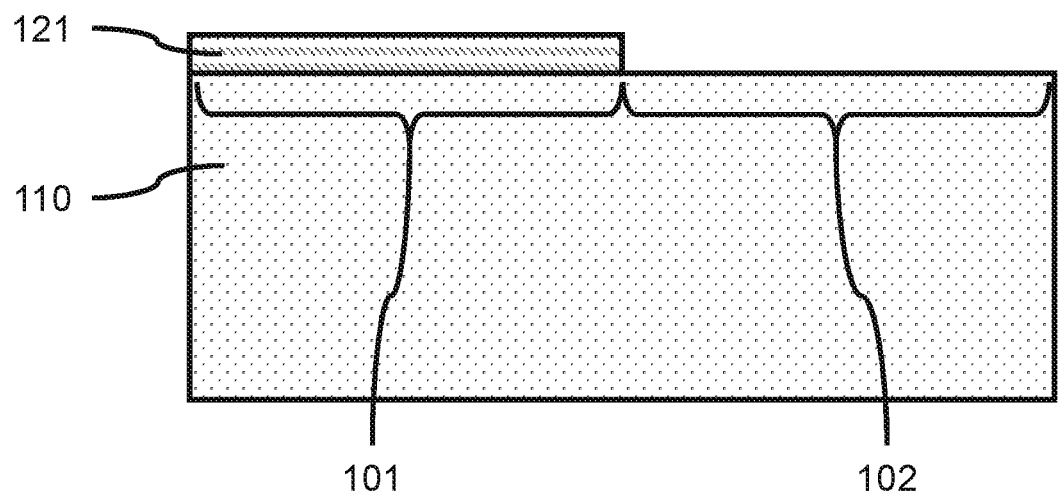
FIG. 2 is a cross-sectional side view showing a patterned mask segment on the substrate and an exposed portion of the substrate, in accordance with an embodiment of the present invention.

FIG. 2 is a cross-sectional side view showing a patterned mask segment on the substrate and an exposed portion of the substrate, in accordance with an embodiment of the present invention In one or more embodiments, the masking layer 120 can be patterned and developed to form a mask segment 121 that covers a portion of the substrate surface, where the remaining masked portion of the substrate 110 can form a first region 101. A portion of the masking layer 120 can be developed and removed to expose at least one portion of the underlying surface of the substrate 110, where the exposed portion of the substrate 110 can form a second region 102 of the substrate surface. The second region 102 can be adjacent to the first region 101, such that vertical fins formed on one region are neighbors to the vertical fins formed on the adjacent region.

Figure 3:
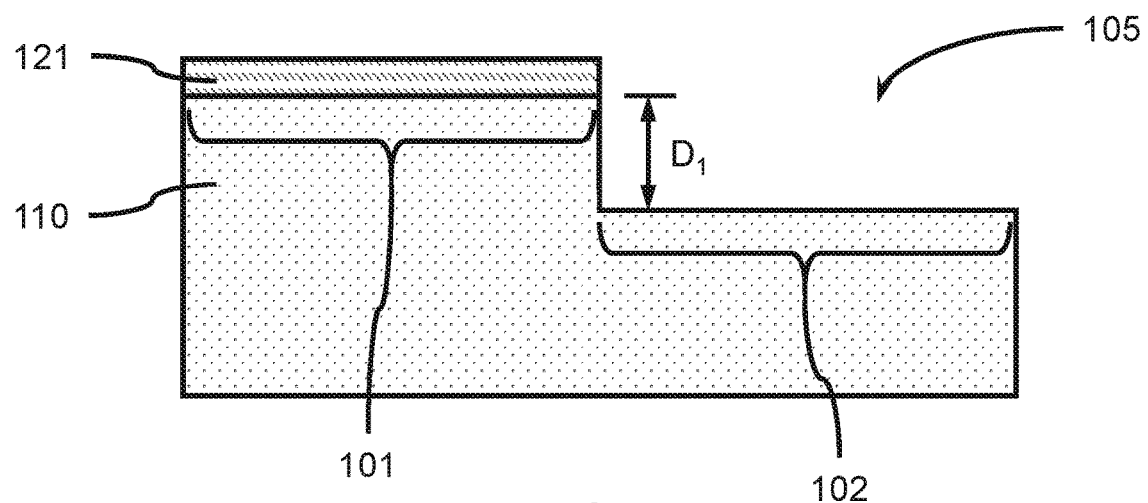
FIG. 3 is a cross-sectional side view showing a recess formed in the substrate, in accordance with an embodiment of the present invention.

FIG. 3 is a cross-sectional side view showing a recess formed in the substrate, in accordance with an embodiment of the present invention In one or more embodiments, a portion of the substrate 110 exposed by removal of a portion of the masking layer 120 can be removed to form a recess 105 in the substrate, where the recess can be formed by a directional etch, for example a reactive ion etch (RIE) to provide defined sidewalls. The remaining mask segment 121 can be adjacent to the recess 105, where the second region 102 is recessed, and the first region 101 is covered by mask segment 121. The recess 105 can define the area of a second region 102 of the substrate 110.

In one or more embodiments, the recess 105 can be formed to a predetermined depth, $D_1$, that can be substantially equal to the intended height of a subsequently formed fin layer, and thereby the intended height of subsequently formed fin layer pillar(s). In various embodiments, the recess 105 can have a depth in the range of about 10 nm to about 100 nm, or in the range of about 10 nm to about 40 nm, or in the range of about 10 nm to about 30 nm, or in the range of about 15 nm to about 50 nm, or in the range of about 20 nm to about 50 nm, or in the range of about 30 nm to about 50 nm. Other depths are also contemplated.

In one or more embodiments, the depth, $D_1$, can be about ½ to about ⅔ of the intended height of subsequently formed vertical fins.

Figure 4:
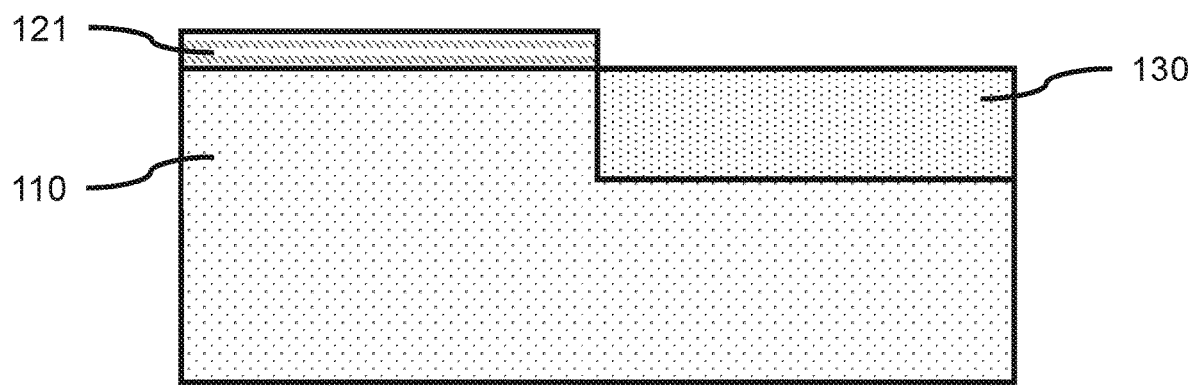
FIG. 4 is a cross-sectional side view showing a fin layer formed in a recess on a second region of the substrate, in accordance with an embodiment of the present invention.

FIG. 4 is a cross-sectional side view showing a fin layer formed in a recess on a second region of the substrate, in accordance with an embodiment of the present invention.

In one or more embodiments, a fin layer 130 can be formed on the exposed surface of the substrate 110 at the bottom of a recess 105, where the fin layer can be a material different from the material of the substrate 110. The fin layer 130 can be formed on the exposed surface of the substrate 110 by epitaxial growth (e.g., vapor phase epitaxy (VPE), ion beam epitaxy (IBE), molecular beam epitaxy (MBE), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), liquid-phase epitaxy (LPE), or other suitable process), where the fin layer 130 is a single crystal with the same crystal orientation as the substrate surface on which it is grown. In various embodiments, the fin layer 130 can fill the recess 105 such that the fin layer 130 has a thickness that is the same as the depth, $D_1$, of the recess. The fin layer 130 may be formed to a thickness greater than the depth, $D_1$, and a portion of the fin layer 130 subsequently removed to reduce the thickness of the fin layer, for example, by chemical-mechanical polishing (CMP), where the final thickness is the same as the depth, $D_1$.

In one or more embodiments, the fin layer 130 has a thickness in the range of about 10 nm to about 70 nm, or in the range of about 10 nm to about 50 nm, or in the range of about 10 nm to about 30 nm, or in the range of about 15 nm to about 45 nm. Other thicknesses are also contemplated.

In one or more embodiments, the fin layer 130 can be silicon-germanium (SiGe) or carbon-doped silicon-germanium (SiGe:C). In various embodiments, a silicon-germanium fin layer 130 can have a germanium concentration in the range of about 5 at. % to about 60 at. %, or in the range of about 5 at. % to about 30 at. %, or in the range of about 5 at. % to about 25 at. %, or in the range of about 5% (i.e., $Si_{.95}Ge_{.05}$) to about 15% (i.e., $Si_{.85}Ge_{.15}$), or in the range of about 10 at. % to about 15 at. %, or in the range of about 8% (i.e., $Si_{.92}Ge_{.08}$) to about 12% (i.e., $Si_{.88}Ge_{.12}$), or in the range of about 10% (i.e., $Si_{0.9} Ge_{0.1}$). Other germanium concentrations are also contemplated.

In one or more embodiments, the mask segment(s) 121 can be removed from the substrate 110, for example, by etching (e.g., wet etching, dry plasma etching, etc.), to expose the first region 101 of the substrate 110. A CMP may be used to provide a uniform, smooth, flat surface to the substrate and the fin layer.

Figure 5:
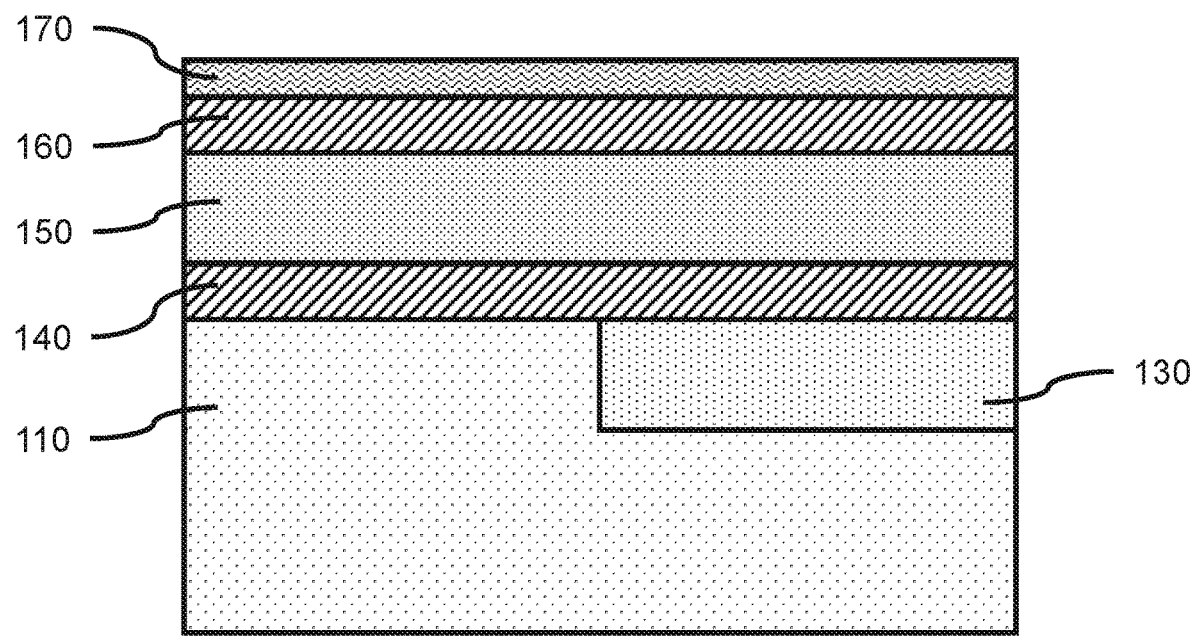
FIG. 5 is a cross-sectional side view showing a fin template layer formed on the surface of the substrate and fin layer, a mandrel layer formed on the fin template layer, a mandrel template layer formed on the mandrel layer, and a mandrel mask layer formed on the mandrel template layer, in accordance with an embodiment of the present invention.

FIG. 5 is a cross-sectional side view showing a fin template layer formed on the surface of the substrate and fin layer, a mandrel layer formed on the fin template layer, a mandrel template layer formed on the mandrel layer, and a mandrel mask layer formed on the mandrel template layer, in accordance with an embodiment of the present invention.

In one or more embodiments, a fin template layer 140 can be formed on at least a portion of a surface of a substrate 110 and a portion of the fin layer 130, where the fin template layer 140 can cover a portion of a first region and a portion of a second region of the substrate. In various embodiments, the fin template layer 140 can be formed on the substrate surface by CVD, PECVD, PVD, thermal growth, or combinations thereof, where the fin template layer 140 can be blanket deposited on the substrate.

In various embodiments, a fin template layer 140 can be a hard mask layer for masking the substrate 110 and fin layer 130 during transfer of a vertical fin pattern to the substrate and fin layer. The fin template layer 140 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), titanium nitride (TiN), or combinations thereof, where the fin template layer 140 may include one or more layers. The fin template layer 140 can also act as an etch-stop layer for forming sacrificial mandrels from a mandrel layer, where the fin template layer 140 can be selectively etched relative to other layers. In one or more embodiments, the fin template layer 140 can be silicon nitride (SiN), for example, $Si_3N_4$.

In one or more embodiments, a mandrel layer 150 can be formed on at least a portion of the fin template layer 140. In one or more embodiments, the mandrel layer 150 can be formed by CVD, PECVD, PVD, a spin-on process, or combinations thereof, where the mandrel layer 150 can be blanket deposited on the fin template layer 140.

In various embodiments, mandrel layer 150 can be a sacrificial material that can be easily and selectively patterned and etched. The mandrel layer 150 can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof.

In one or more embodiments, a mandrel template layer 160 can be formed on the mandrel layer 150, where the mandrel template layer can be a hard mask layer. In various embodiments, the mandrel template layer can be optional, and other processes can be used (e.g., direct write).

The mandrel template layer 160 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the mandrel template layer 160 may include one or more layers.

In one or more embodiments, a mandrel mask layer 170 can be formed on the mandrel template layer 160, where the mandrel mask layer 170 can be a hard mask layer or soft mask layer for masking the mandrel template layer 160. In one or more embodiments, the mandrel mask layer 170 can be a lithographic resist material (e.g., a photo resist material, an e-beam resist material, etc.).

In one or more embodiments, the mandrel mask layer 170 can be a positive or negative resist material, for example, Poly(methyl methacrylate) (PMMA) or SU-8, or an electron-beam (e-beam) cured material, for example, hydrogen silsesquioxane (HSQ).

Figure 6:
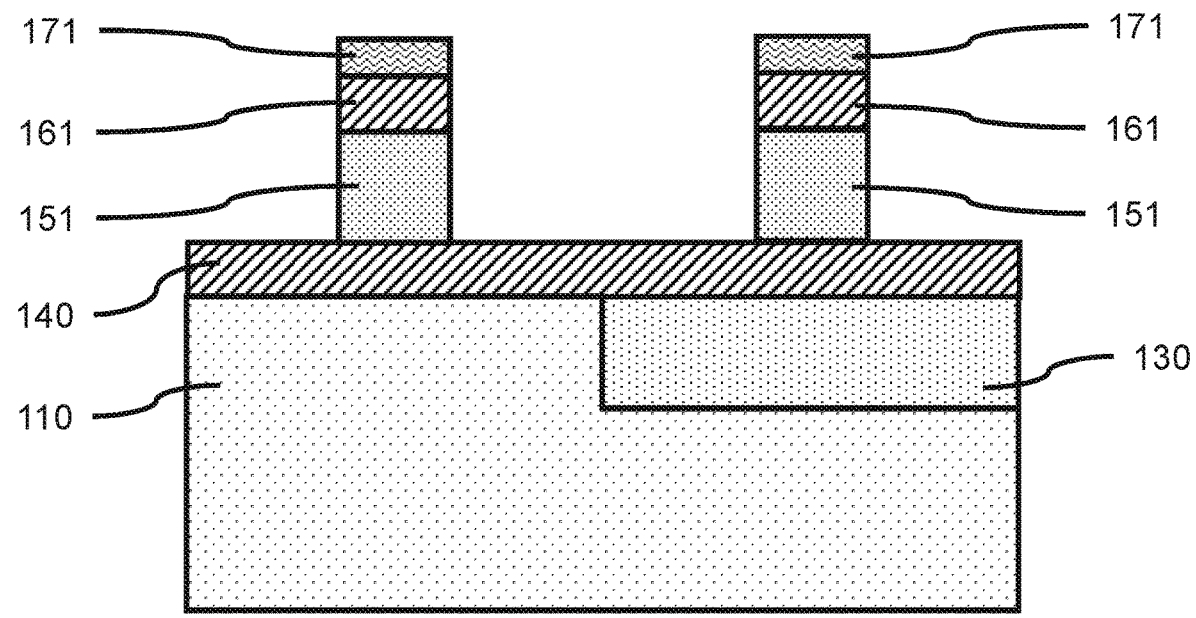
FIG. 6 is a cross-sectional side view showing a patterned mandrel mask layer and mandrel template layer on a plurality of sacrificial mandrels, in accordance with an embodiment of the present invention.

FIG. 6 is a cross-sectional side view showing a patterned mandrel mask layer and mandrel template layer on a plurality of sacrificial mandrels, in accordance with an embodiment of the present invention.

In one or more embodiments, the mandrel mask layer 170 can be patterned and developed to form mandrel mask segments 171 on the mandrel template layer 160, where the mandrel mask segments 171 cover portions of the mandrel template layer 160 and expose other portions of the mandrel template layer.

In one or more embodiments, the exposed portions of the mandrel template layer 160 can be removed by wet etching or by a dry plasma etch, where the dry plasma can be a directional reactive ion etch (RIE). Removal of the exposed portions of the mandrel template layer 160 can form one or more mandrel templates 161 below the mandrel mask segments 171, and expose underlying portions of the mandrel layer 150. The mandrel templates 161 can be used to transfer the mandrel pattern to the mandrel layer 150.

In one or more embodiments, once the mandrel templates 161 are formed, a directional etch (e.g., RIE) can be used to remove exposed portions of the mandrel layer 150 to form sacrificial mandrels 151 on the underlying fin template layer 140. Portions of the fin template layer can be exposed between the sacrificial mandrel(s) 151.

In one or more embodiments, the mandrel mask segments 171 can be removed to expose the mandrel templates 161, for example, by stripping or ashing.

Figure 7:
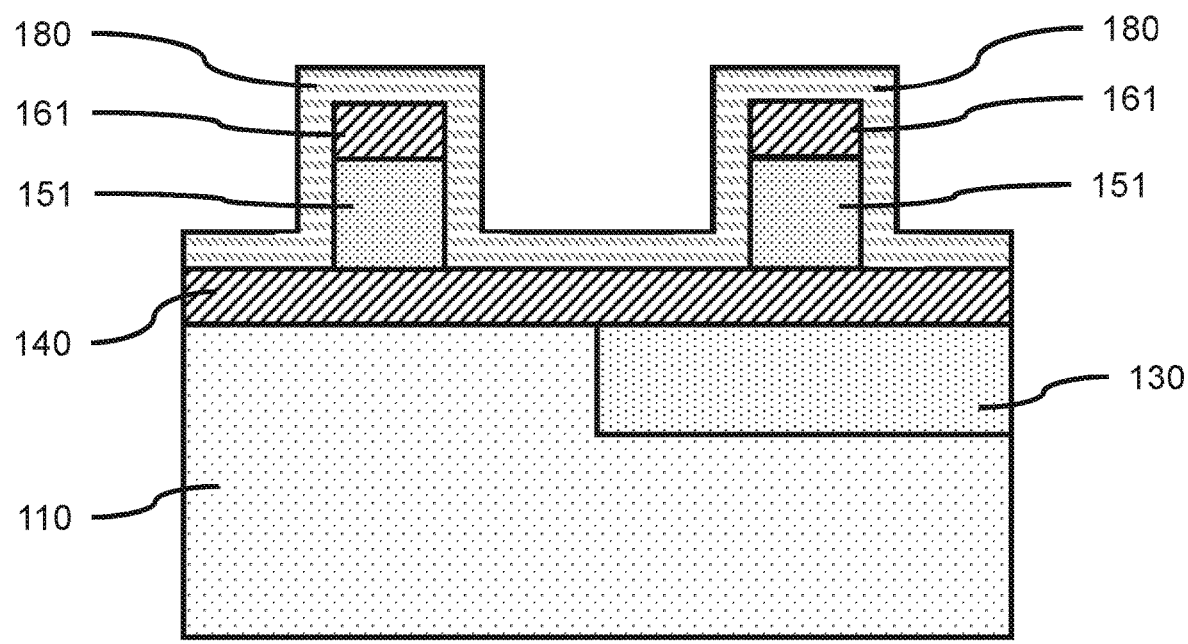
FIG. 7 is a cross-sectional side view showing a sidewall layer formed on the mandrel templates, sacrificial mandrels, and fin template layer, in accordance with an embodiment of the present invention.

FIG. 7 is a cross-sectional side view showing a sidewall layer formed on the mandrel templates, sacrificial mandrels, and fin template layer, in accordance with an embodiment of the present invention.

In one or more embodiments, a sidewall spacer layer 180 can be formed on the exposed surfaces of the mandrel templates 161 and sacrificial mandrels 151, where the sidewall spacer layer 180 can be formed by a conformal deposition, for example, ALD or PEALD, to control the thickness of the sidewall spacer layer 180.

In various embodiments, the sidewall spacer layer 180 can have a thickness in the range of about 8 nm to about 40 nm, or about 10 nm to about 30 nm, or about 15 nm to 20 nm, where the thickness of the sidewall spacer layer 160 can determine the initial width of subsequently formed vertical fins.

In various embodiments, the sidewall spacer layer 180 can be silicon oxide (SiO), silicon nitride (SiN), silicon oxynitride (SiON), silicon carbide (SiC), conformal amorphous carbon (a-C), or combinations thereof.

In one or more embodiments, a sacrificial mandrel 151 and sidewall spacer layer 180 can be formed on a first region of the substrate 110, and a sacrificial mandrel 151 and sidewall spacer layer 180 can be formed on a fin layer 130 on a second region of the substrate 110. The sacrificial mandrels 151 and sidewall spacer layer 180 can be used to form vertical fins on two different regions of the substrate from two different materials at the same time. Other processes can be used to form vertical fins on two different regions of the substrate from two different materials at the same time.

Figure 8:
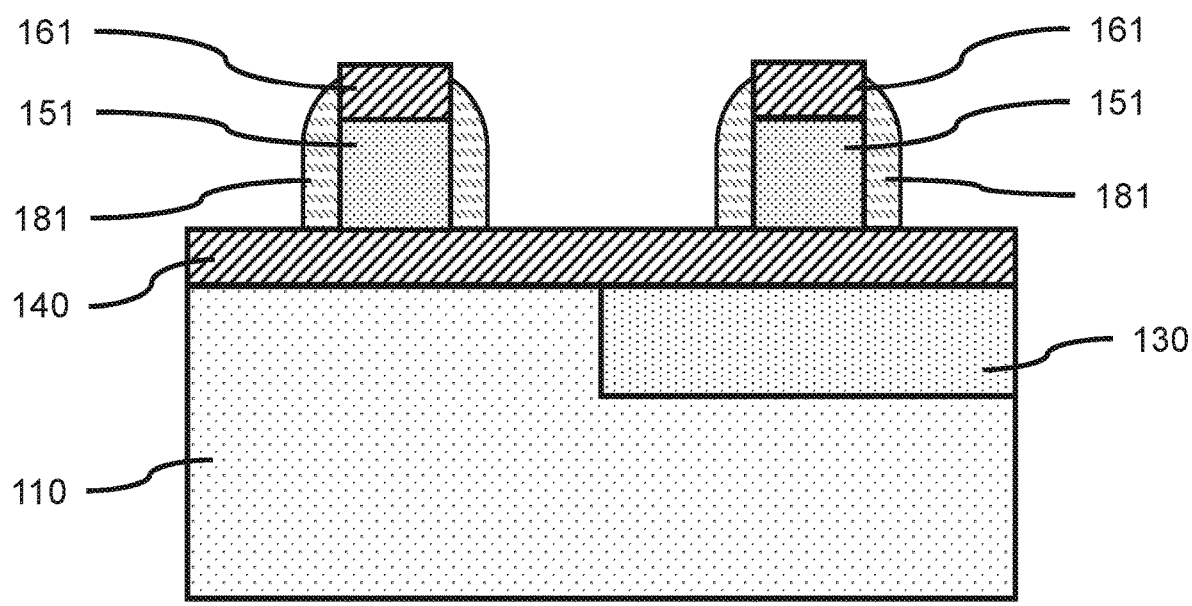
FIG. 8 is a cross-sectional side view showing sidewalls spacers formed on opposite sides of the sacrificial mandrels, in accordance with an embodiment of the present invention.

FIG. 8 is a cross-sectional side view showing sidewalls spacers formed on opposite sides of the sacrificial mandrels, in accordance with an embodiment of the present invention.

In one or more embodiments, a portion of the sidewall spacer layer 180 on the fin template layer 140 and the top surfaces of the mandrel templates 161 can be removed by an etch-back process using a directional etch, for example, RIE to remove the portion of the sidewall spacer layer on surfaces approximately perpendicular to the incident ion beam, while the sidewall spacer layer 180 on the vertical sidewalls of the sacrificial mandrels 151 remain essentially unetched. The remaining portion of the sidewall spacer layer 180 on the sacrificial mandrels 151 can form sidewall spacers 181, where the thickness of the sidewall spacer layer 180 can determine the width of the sidewall spacers 181.

In various embodiments, a plurality of vertical fins can be formed by a sidewall image transfer (SIT) process, self-aligned double patterning (SADP), or self-aligned quadruple patterning (SAQP) to provide a tight pitch between vertical fins. In various embodiments, a direct print can be used to provide fins. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. While the figures illustrate a sidewall image transfer (SIT) process, this is for descriptive purposes, since these other processes are also contemplated, and the scope of the claims and invention should not be limited to the particular illustrated features.

Figure 9:
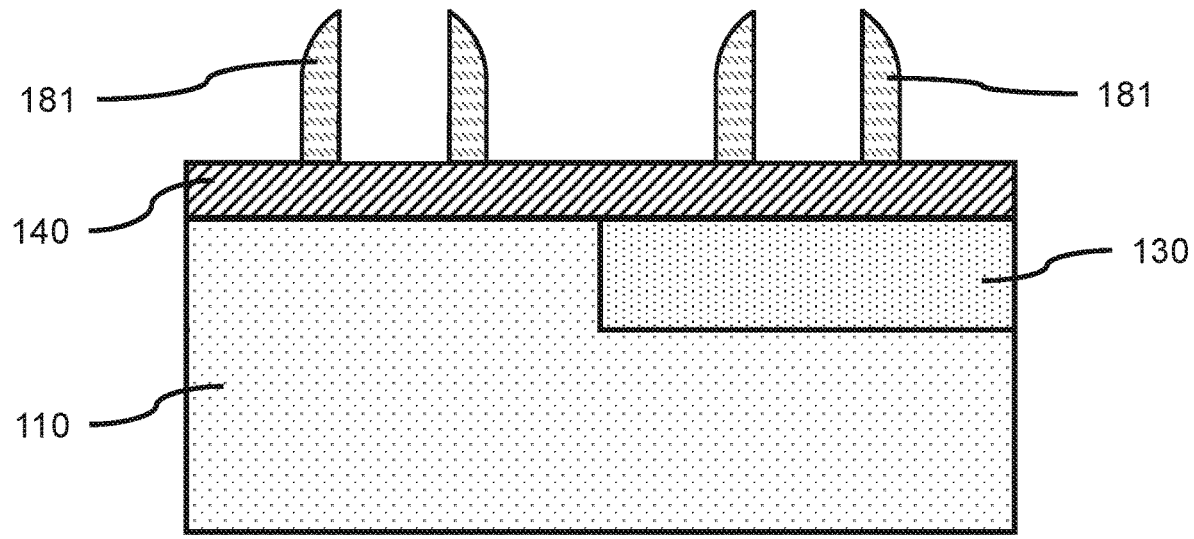
FIG. 9 is a cross-sectional side view showing sidewall spacers formed on the fin template layer after removal of the sacrificial mandrels, in accordance with an embodiment of the present invention.

FIG. 9 is a cross-sectional side view showing sidewall spacers formed on the fin template layer after removal of the sacrificial mandrels, in accordance with an embodiment of the present invention.

In one or more embodiments, the mandrel templates 161 and sacrificial mandrels 151 can be removed after the sidewalls spacers 181 are formed, where the mandrel templates 161 and sacrificial mandrels 151 can be removed by selective etching (e.g., RIE or wet etch). The mandrel templates 161 and sacrificial mandrels 151 can be selectively removed, while the sidewalls spacers 181 remain on the fin template layer 140 forming a fin pattern. The sidewalls spacers 181 can be made of a different material from the mandrel templates 161 and sacrificial mandrels 151, so the mandrel templates 161 and sacrificial mandrels 151 can be selectively removed.

In one or more embodiments, one or more sidewalls spacers 181 can be formed on a region of the substrate made of a first material and one or more sidewalls spacers 181 can be formed on a region of the substrate made of a second material different from the first material. The first material and second material can have different etch rates.

In a non-limiting exemplary embodiment, the first material can be silicon and the second material can be silicon-germanium.

Figure 10:
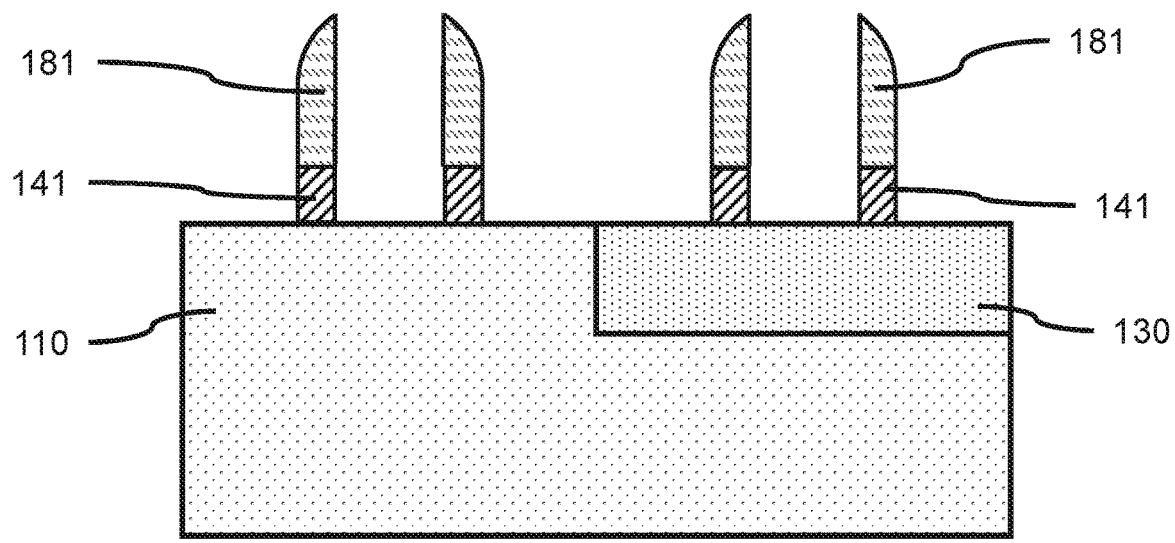
FIG. 10 is a cross-sectional side view showing fin templates formed on the substrate and fin layer with sidewall spacers on each fin template, in accordance with an embodiment of the present invention.

FIG. 10 is a cross-sectional side view showing fin templates formed on the substrate and fin layer with sidewall spacers on each fin template, in accordance with an embodiment of the present invention.

In one or more embodiments, the fin pattern formed by the sidewalls spacers 181 can be transferred to the fin template layer 140 by removing the exposed portion of the fin template layer 140. In various embodiments, a portion of the fin template layer 140 can be removed to form a fin template 141 below each of the one or more sidewall spacers 181 by a directional RIE. Removal of the portions of the fin template layer 140 can expose portions of the underlying substrate 110, surface/active layer(s), or source/drain layer(s) between each of the sidewall spacers 181 and fin templates 141.

Figure 11:
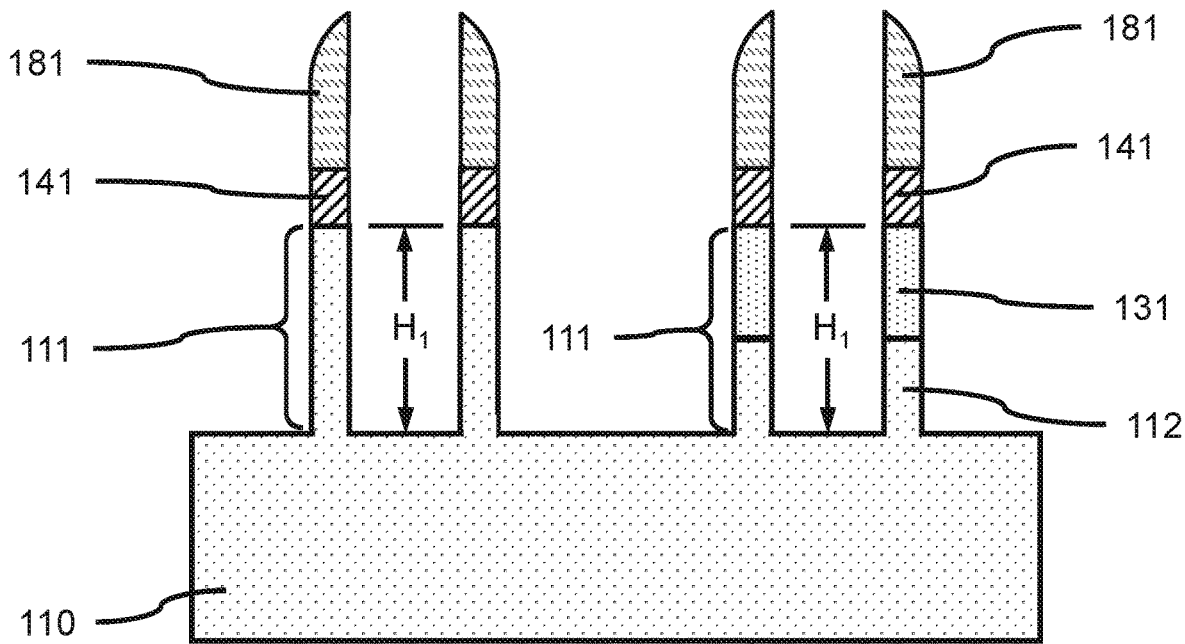
FIG. 11 is a cross-sectional side view showing a plurality of vertical fins formed on the substrate and a plurality of vertical fins formed on the fin layer with a fin template and a sidewall spacer on each vertical fin, in accordance with an embodiment of the present invention.

FIG. 11 is a cross-sectional side view showing a plurality of vertical fins formed on the substrate and a plurality of vertical fins formed on the fin layer with a fin template and a sidewall spacer on each vertical fin, in accordance with an embodiment of the present invention.

In one or more embodiments, one or more vertical fin(s) 111 can be formed on the substrate 110, where the vertical fin(s) 111 can be formed by removing a portion of the substrate 110 and/or fin layer 130 between and/or around a sidewall spacer 181 and fin template 141. The one or more vertical fin(s) 111 can be formed by a directional etch, for example, a reactive ion etch (RIE) that removes the portion of the substrate 110 or fin layer 130 not covered by a sidewall spacer 181. Vertical fin(s) 111 can be formed with a tapered profile having a greater width at the base of the vertical fin(s) and a narrower width at the top of the fin(s), or with a straight profile (i.e., an essentially uniform width), where the straight or tapered profile can be produced as an aspect of the etching process.

In one or more embodiments, one or more fin layer pillar(s) 131 can be formed from the underlying fin layer 130 on the substrate 110, where the fin layer pillar(s) 131 can be formed by removing a portion of the fin layer 130 between and/or around a sidewall spacer 181 and fin template 141. The one or more fin layer pillar(s) 131 can be formed by a directional etch, for example, a reactive ion etch (RIE) that removes the portion of the fin layer 130 not covered by a sidewall spacer 181 and fin template 141. Fin layer pillar(s) 131 can be formed with a tapered profile having a greater width at the base and a narrower width at the top, or with a straight profile (i.e., an essentially uniform width, as depicted in FIG. 11), where the straight or tapered profile can be produced as an aspect of the etching process.

In one or more embodiments, the fin layer pillar(s) 131 can be on a substrate pillar 112 formed from the underlying substrate 110, where a directional etching process can be continued into the underlying substrate. Portions of the substrate 110 below the fin layer 130 can be removed using the directional etch to increase the height of the vertical fin 111 formed by the fin layer pillar 131 and substrate pillar 112.

In various embodiments, the height of the fin layer pillar 131 can form ½ to ⅔ of the total height, $H_1$, of the vertical fin 111, and the height of the substrate pillar 112 can form ⅓ to ½ of the total height, $H_1$, of the vertical fin.

In one or more embodiments, the vertical fin(s) 111 can be formed with an initial width, $W_1$, intentionally greater than a predetermined final vertical fin width, $W_2$. In various embodiments, the vertical fin(s) 111 can have an initial width, $W_1$, in the range of about 8 nm to about 40 nm, or about 10 nm to about 30 nm, or about 15 nm to 20 nm, where the initial vertical fin width can be greater than an intended final vertical fin width, $W_2$. In various embodiments, the initial vertical fin width, $W_1$, can be in the range of 50% to 100% greater, or 25% to 75% greater, or 50% to 75% greater than the intended final vertical fin width, $W_2$. Other ranges of the width difference are also contemplated. When the difference in germanium concentration between the material compositions of fin layer 130 and substrate 110 is smaller (e.g. less than 15% Ge), substantially the same width can be formed for all fins, where fins with substantially the same width decreases the variability in properties of the later formed devices.

In one or more embodiments, the vertical fin(s) 111 can have a total height, $H_1$, in the range of about 20 nm to about 100 nm or about 30 nm to about 75 nm, or about 45 nm to about 60 nm. The vertical fin(s) 111 can be rectangular with a long axis (i.e., length) and a narrow axis (i.e., width) perpendicular to the long axis. In some embodiments, the vertical fin(s) 111 can have cross-sectional geometries that are trapezoidal (i.e., tapered fins). The vertical fin(s) 111 formed from only the substrate material can be formed at the same time by the same process, such as the etching process, as the vertical fin(s) 111 including a fin layer pillar 131.

In one or more embodiments, the vertical fins(s) 111 can be strained or unstrained fin(s), for example, a strained $Si_xGe_{(1-x)}$ PFET and/or an unstrained silicon NFET. The vertical fin(s) 111 on the substrate may be used to fabricate one or more horizontal transport fin field effect transistors (HT FinFETs), where the current flows through the fin channel parallel to the plane of the substrate 110. The vertical fin(s) 111 on the substrate may be used to fabricate one or more vertical transport fin field effect transistors (VT FinFETs), where the current flows through the fin channel perpendicular to the plane of the substrate 110. The HT FinFETs may be electrically coupled to form CMOS devices, where an NFET and a PFET are coupled to form the CMOS device.

Figure 12:
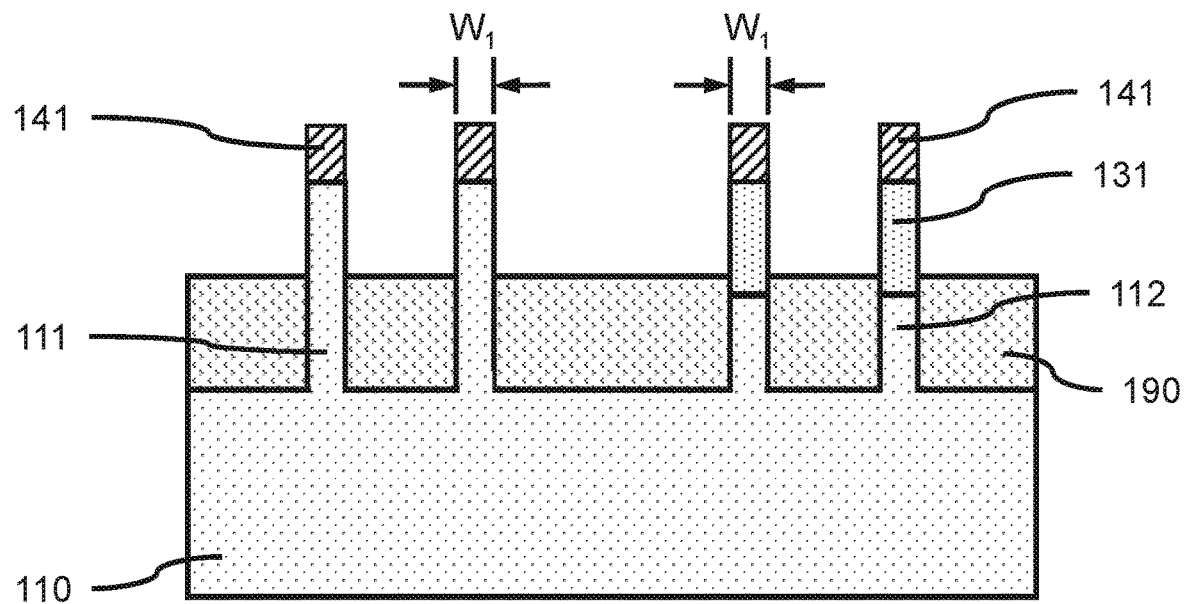
FIG. 12 is a cross-sectional side view showing a filler layer formed on the vertical fins(s) 111, in accordance with an embodiment of the present invention.

FIG. 12 is a cross-sectional side view showing a filler layer formed on the vertical fins(s) 111, in accordance with an embodiment of the present invention.

In one or more embodiments, the sidewall spacers 181 can be removed from the fin templates 141 and vertical fins 111. The sidewall spacers 181 can be removed, for example, by an isotropic dry etch, a selective RIE process, or a selective wet etch. The underlying fin template(s) 141 can act as an etch stop. The fin template(s) 141 can remain on the vertical fin(s) 111 after the sidewall spacers 181 are removed, and be subsequently removed by a separate selective etch.

In one or more embodiments, a filler layer 190 can be formed on the exposed surfaces of the vertical fin(s) 111, including the fin layer pillar 131, and exposed surface of the substrate 110, where the filler layer 170 can be formed by a blanket or directional deposition, for example, by CVD, LPCVD, PECVD, high density plasma (HDP) depositions, gas cluster ion beam (GCIB), or combinations thereof.

In one or more embodiments, the filler layer can be silicon oxide (SiO), a low-k dielectric, a flowable polymeric material, or a combination thereof. A low-k dielectric material can include, but not be limited to, carbon-doped silicon oxide (SiOC), a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

In one or more embodiments, the filler layer 190 can fill the spaces between vertical fins 111, and be etched back to a predetermined height, where the filler layer 190 can cover the substrate pillar 112 and at least a portion of the fin layer pillar 131. In one or more embodiments, a planarization step, such as chemical mechanical polish (CMP), can be performed between the deposition and etch back of the filler layer 190 to provide a smooth, flat surface for subsequent processing.

Figure 13:
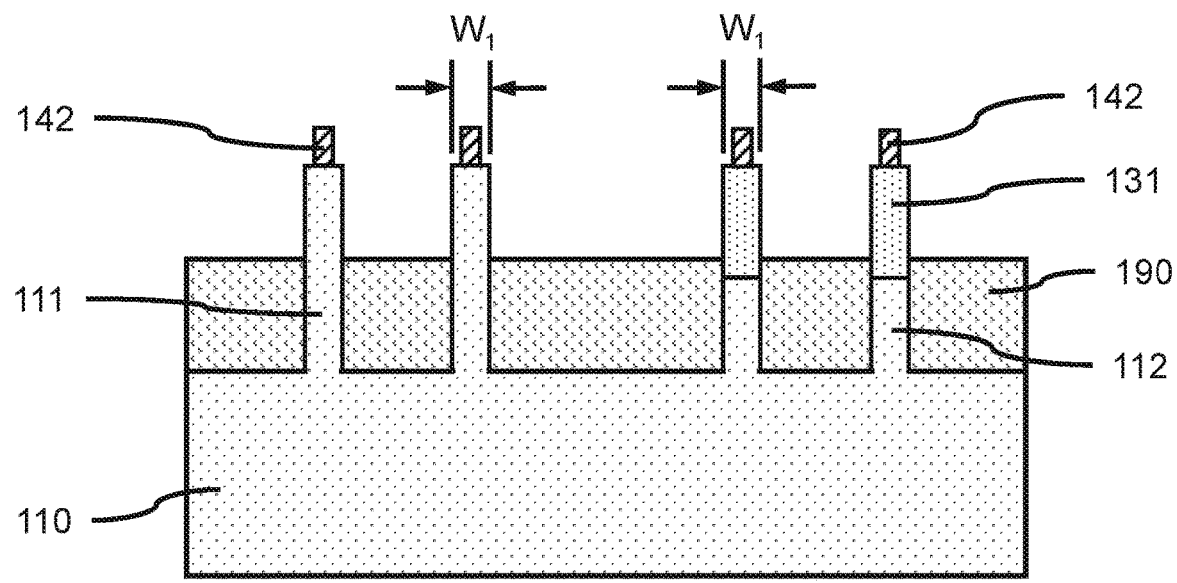
FIG. 13 is a cross-sectional side view showing fin templates with reduced widths forming template posts, in accordance with an embodiment of the present invention.

FIG. 13 is a cross-sectional side view showing fin templates with reduced widths forming template posts, in accordance with an embodiment of the present invention.

In one or more embodiments, portions of the fin templates 141 can be removed to reduce the width of the fin templates 141 to form template posts 142. In various embodiments, an isotropic etch (e.g., SiCoNi™, wet etch, dry plasma etch) can be used to remove portions of the fin templates 141 from the sidewalls and top surface. A portion of the top surface of the vertical fins 111 can be exposed by reducing the width of the fin templates 141. In various embodiments, removal of a portion of the fin templates 141 to form template posts 142 can be optional. The width of the fin templates 141, $W_1$ to $W_2$, can be adjusted to effect the geometry of the substrate pillar 112 and/or the fin layer pillar 131 through different spatial diffusion of reactants into the substrate pillar 112 and/or the fin layer pillar 131. An exposed top surface of the vertical fins 111 can allow more reactant to penetrate into a vertical fin, substrate pillar 112, and/or the fin layer pillar 131 from different angles. A narrower template post 142 allows more material conversion at the top of the vertical fins 111, which can be more important for wider vertical fins.

A higher Ge concentration can provide faster conversion of a SiGe fin layer pillar 131 that can result in a thicker composite pillar layer than composite fin layer.

In one or more embodiments, the reduced width, $W_2$, of the template posts 142 can be less than the initial width, $W_1$, of the vertical fins 111, where the difference in widths, $W_1-W_2$, can expose a predetermined portion of the vertical fins 111.

Figure 14:
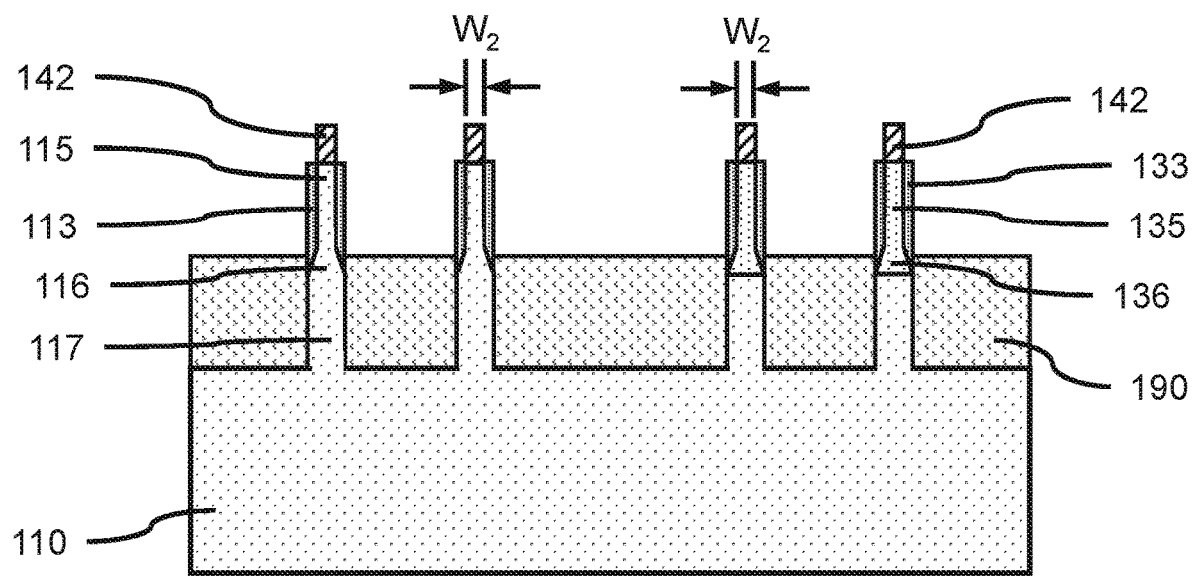
FIG. 14 is a cross-sectional side view showing the conversion of an exposed portion of the vertical fins, where some vertical fins include a fin layer pillar, to a composite fin layer, in accordance with an embodiment of the present invention.

FIG. 14 is a cross-sectional side view showing the conversion of an exposed portion of the vertical fins, where some vertical fins include a fin layer pillar, to a composite fin layer, in accordance with an embodiment of the present invention.

In one or more embodiments, an exposed portion of the vertical fins 111 can be converted into a composite fin layer 113 having a chemical composition different from the chemical composition of the fin layer pillar 131 and substrate 110. The exposed portion of the vertical fins 111 can be converted into a different chemical composition by reacting the exposed material with a reactant. The outer layer of the vertical fins 111 can be converted to form a composite fin layer 113 on a fin core 115, where a portion of the vertical fins 111 below the top surface of the filler layer 190 can form a flared fin section 116 (e.g., trapezoidal, trumpet shaped) due to reactant diffusion. The partial conversion of the vertical fins 111 below the top surface of the filler layer 190 can form a flared fin section 116 between the fin core 115 and a lower fin section 117 that is unreacted.

In one or more embodiments, an exposed portion of the fin layer pillar 131 can be converted into a composite pillar layer 133 having a chemical composition different from the chemical composition of the fin layer pillar 131 and substrate 110. The outer layer of the fin layer pillars 131 can be converted to form the composite pillar layer 133 on a pillar core 135, where a portion of the fin layer pillar 131 below the top surface of the filler layer 190 can form a flared pillar section 136 due to reactant diffusion. The partial conversion of the fin layer pillar 131 below the top surface of the filler layer 190 can form a flared pillar section 136 between the pillar core 135 and the substrate pillar 112 that is unreacted. In various embodiments, formation of the composite pillar layer 133 through a reaction that consumes a portion of the fin layer pillar 131 can create a germanium (Ge) concentration gradient in the flared pillar section 136 due to increased Ge concentration density towards the narrowest portion of the flared pillar section 136 and a Ge concentration substantially the same as the germanium concentration in the fin layer 130 at the widest portion of the flared pillar section, with a concentration gradient therebetween. The germanium concentration in the substrate pillar 112 can remain the same as the substrate 110 Ge concentration (i.e., essentially 0% Ge).

In one or more embodiments, the composite fin layer 113 and composite pillar layer 133 can be formed by reacting the vertical fins 111 and fin layer pillars 131 at the same time (e.g., through co-exposure to the reactants). In one or more embodiments, the vertical fins 111 and fin layer pillars 131 can be different materials that react at substantially comparable rates to form composite fin layers 113 and composite pillar layers 133 having substantially comparable thicknesses. In one or more embodiments, the vertical fins 111 and fin layer pillars 131 can be different materials that react at different rates to form composite fin layers 113 and composite pillar layers 133 having different thicknesses. In various embodiments, the reaction can be an oxidation, where the oxidation can be a thermal oxidation or a chemical oxidation. The reaction can be a condensation reaction that causes germanium to migrate from the surface region of the fin layer pillars 131 into the pillar core 135. The initial width, $W_1$, can be predetermined based on the thickness of composite fin layers 113 and composite pillar layers 133 to be formed.

In one or more embodiments, the composite fin layer 113 has a thickness in the range of about 1 nm to about 10 nm, or in the range of about 3 nm to about 5 nm.

In one or more embodiments, the composite pillar layer 133 has a thickness in the range of about 1 nm to about 10 nm, or in the range of about 2 nm to about 10 nm, or in the range of about 3 nm to about 5 nm.

In a non-limiting exemplary embodiment, the silicon of both the vertical fins 111 composed of silicon substrate material and the vertical fins 111 having exposed fin layer pillars 131 composed of SiGe can be at least partially oxidized to form a silicon oxide (SiO) composite fin layer 113 on a Si fin core 115, and a SiO composite pillar layer 133 on an SiGe pillar core 135. An oxidizing agent can be used to form the silicon oxide (SiO) from the silicon (Si) of the vertical fins 111, where the oxidizing agent can include, but not be limited to, atomic oxygen (O), molecular oxygen ($O_2$), oxygen plasma, ozone ($O_3$), water ($H_2O$), ionized oxygen ($O_2^+$), and suitable combinations thereof. Since an oxidizing agent can diffuse through an SiO composite fin layer 113, the composite layer 113 can be grown to a predetermined thickness, and a predetermined amount of Si consumed from the vertical fins 111. Similarly, the oxidizing agent can be used to form the silicon oxide (SiO) of the composite pillar layer 133 from the silicon (Si) of the SiGe in layer pillars 131, while increasing the Ge concentration of the pillar core 135. Migration of germanium (Ge) into the pillar core 135 can increase the Ge concentration from the initial value of the fin layer 130 to a final value intended for the vertical fin 111.

In one or more embodiments, the final germanium concentration in the pillar core 135 can be in the range of about 10 at. % to about 85 at. %, or in the range of about 10 at. % to about 50 at. %, or in the range of about 20 at. % to about 50 at. %, where the concentration is atomic percent (at. %). The initial germanium concentration in the fin layer 130 can be in the range of about 5 at. % to about 60 at. %, or in the range of about 5 at. % to about 25 at. %, or in the range of about 10 at. % to about 15 at. %. In various embodiments, the initial germanium concentration in the fin layer 130 is at least 3 at. %. The initial germanium concentration in the fin layer 130 is greater than 0.1%.

The change in germanium concentration from an initial germanium concentration to a final germanium concentration can be calculated from the initial germanium concentration and the final width, $W_2$, by determining the final germanium density. For example, a fin layer pillar 131 having 10 at. % Ge and an initial width, $W_1$, of 10 nm can be converted into a pillar core 135 with a final width, $W_2$, of 5 nm and a 20 at. % Ge concentration because the initial amount of germanium has been condensed into half the fin volume. This relationship and the migration of the germanium can create a Ge concentration profile in the pillar core 135 and flared pillar section 136.

In one or more embodiments, the reduced width, $W_2$, of the template posts 142 and difference in widths, $W_1-W_2$, can affect the thickness of the composite fin layer 113 and composite pillar layer 133.

In various embodiments, the larger the difference between $W_1$ and $W_2$, the greater the Ge % generated in the final SiGe material section (e.g., fin layer pillars 131) of the vertical fin 111, as Ge is further condensed into a final SiGe pillar core 135. In some embodiments, the Ge concentration in the pillar core 135 is substantially uniform from left to right. In some embodiments, the Ge concentration in the pillar core 135 may be higher at the fin surface if the Ge diffusion length is small compared with the width of the fin layer pillars 131. Ge can be condensed and localized in the regions below surfaces.

In various embodiments, a portion of the at least one vertical fin 111 on the first region of the substrate can be removed to leave a fin core 115, and a portion of the at least one vertical fin 111 on the second region of the substrate can be removed to leave a pillar core 135. A vertical fin on the first region can include the fin core, and a vertical fin on the second region can include the pillar core.

Figure 15:
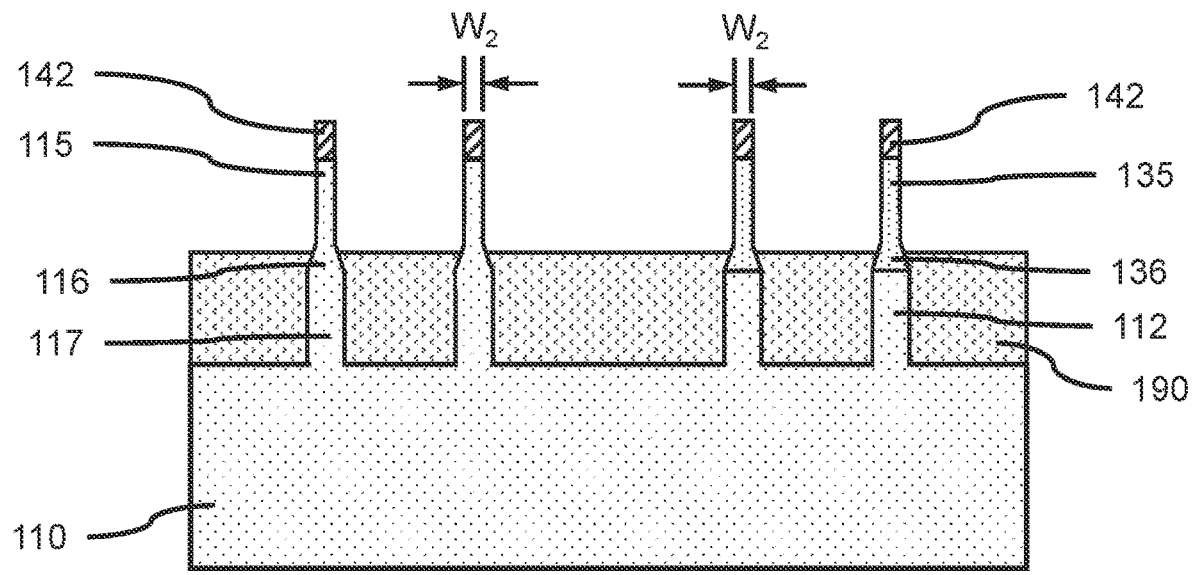
FIG. 15 is a cross-sectional side view showing removal of the composite fin layer and composite pillar layer, in accordance with an embodiment of the present invention.

FIG. 15 is a cross-sectional side view showing removal of the composite fin layer and composite pillar layer, in accordance with an embodiment of the present invention.

In one or more embodiments, the composite fin layer 113 can be removed from the fin core 115, and the composite pillar layer 133 can be removed from the pillar core 135, where the composite fin layer 113 and composite pillar layer 133 can be removed at the same time. The composite fin layer 113 and composite pillar layer 133 can be removed using a selective isotropic etch (e.g., wet etch, etc.) that leaves the fin core 115 and pillar core 135. Where the filler layer 190 is the same material as the composite fin layer 113 or composite pillar layer 133, an upper portion of the filler layer 190 can be removed when the composite fin layer 113 or composite pillar layer 133 is removed.

In one or more embodiments, the final vertical fin width, $W_2$, after removal of the composite fin layer 113 and composite pillar layer 133 can be in the range of 4 nm to 20 nm, or about 5 nm to about 10 nm, or about 7 nm. The final vertical fin width, $W_2$, can be the same for fin core 115 and pillar core 135. Each of the fin cores 115 and each of the pillar cores 135 can have a width, $W_2$, that is less than the width, $W_1$, of a lower fin section 117 below the each of the fin cores 115.

In one or more embodiments, the vertical fin(s) can have 3 sections: (1) a fin core 115 or pillar core 135 with a narrower width, $W_2$, (2) a flared fin section 116 or flared pillar section 136, and (3) a lower fin section 117 or substrate pillar 112 with a greater width, $W_1$. The lower fin section 117 and substrate pillar 112 can be the same material as the substrate, whereas the pillar core 135 and a portion of the flared pillar section 136 can be a semiconductor material with a different composition that the substrate 110. The greater width, $W_1$, of the a lower fin section 117 or substrate pillar 112 can provide greater heat dissipation, where the heat can be ohmic heating generated by the current flow through the vertical fin (e.g., a source/channel/drain of a FET).

Figure 16:
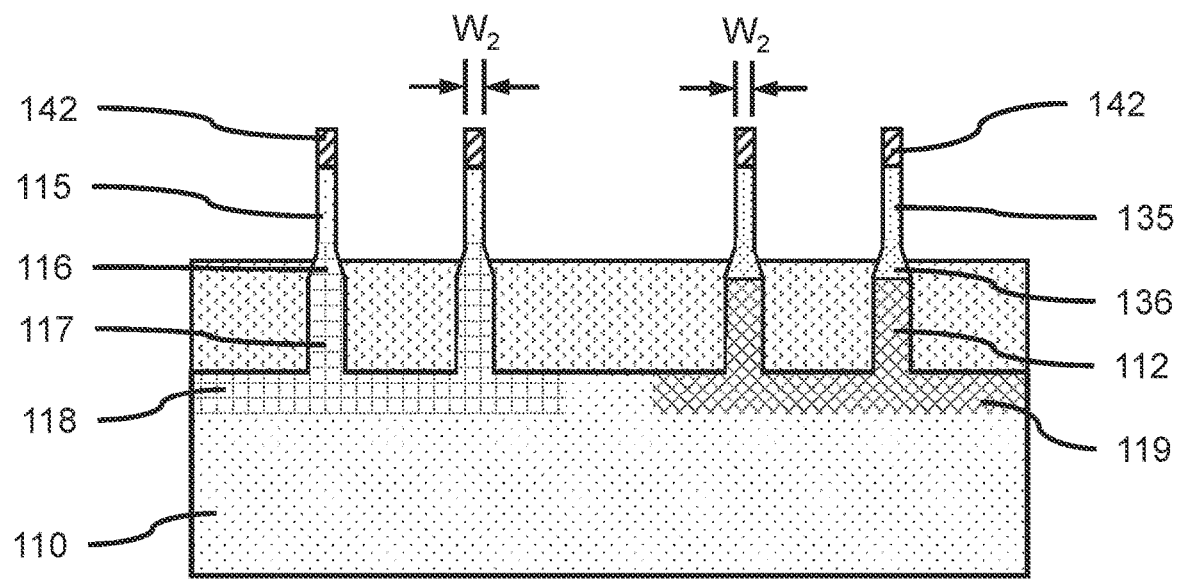
FIG. 16 is a cross-sectional side view showing removal of the composite fin layer and composite pillar layer, and diffusion of dopants into the flared fin section, lower fin section, pillar core, and flared pillar section, in accordance with an embodiment of the present invention.

FIG. 16 is a cross-sectional side view showing the diffusion of dopants into the flared fin section, lower fin section, pillar core, and flared pillar section, in accordance with an embodiment of the present invention.

In one or more embodiments, dopants can be introduced into the flared fin section 116 and the lower fin section 117, and into the flared pillar section 136 and the substrate pillar 112, where dopants can diffuse from the filler layer 190 or a doped oxide liner (e.g., solid phase diffusion). In various embodiments, the same or different dopants can be introduced into the flared fin section 116 and the lower fin section 117, than into the flared pillar section 136 and the substrate pillar 112. The doped flared fin section 116, lower fin section 117, flared pillar section 136, and substrate pillar 112 can form a punch-through stop (PTS) 118 below the fin core 115 and a punch-through stop (PTS) 119 below the pillar core 135 that can form the channels of a PFET or NFET.

For nFET, p-type dopants (e.g., boron, gallium, and indium) can be used in the PTS. For pFET, n-type dopants (e.g., phosphorus, arsenic, antimony) can be used in PTS. The PTS can be formed by any suitable doping techniques, including but not limited to, ion implantation, gas phase doping, plasma doping, plasma immersion ion implantation, cluster doping, infusion doping, liquid phase doping, solid phase doping, etc. In one or more embodiments, a doped liner layer can be formed on at least a portion of the vertical fins 111 and substrate surface, and the dopant caused to migrate from the doped liner layer into the vertical fins 111 and substrate 110. The PTS can be formed below the vertical fin(s) 111 and/or under a source/drain region at the base of a vertical fin. The PTS may be formed before vertical fin formation, but after fin layer 130 formation, such that the dopant may be below the fin layer 130 and in the first region.

Figure 17:
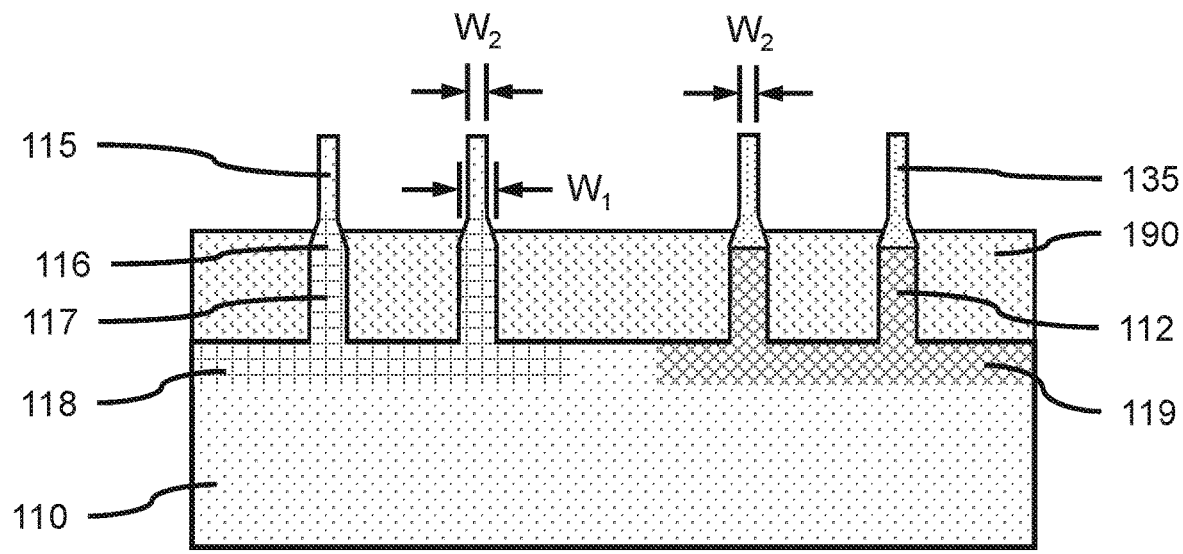
FIG. 17 is a cross-sectional side view showing exposed fin cores and pillar cores after removal of the template posts, in accordance with an embodiment of the present invention.

FIG. 17 is a cross-sectional side view showing exposed fin cores and pillar cores after removal of the template posts, in accordance with an embodiment of the present invention.

In one or more embodiments, the template posts 142 can be removed from the fin cores 115 and pillar cores 135, where the template posts 142 can be removed using a selective isotropic etch (e.g., a wet etch).

Figure 18:
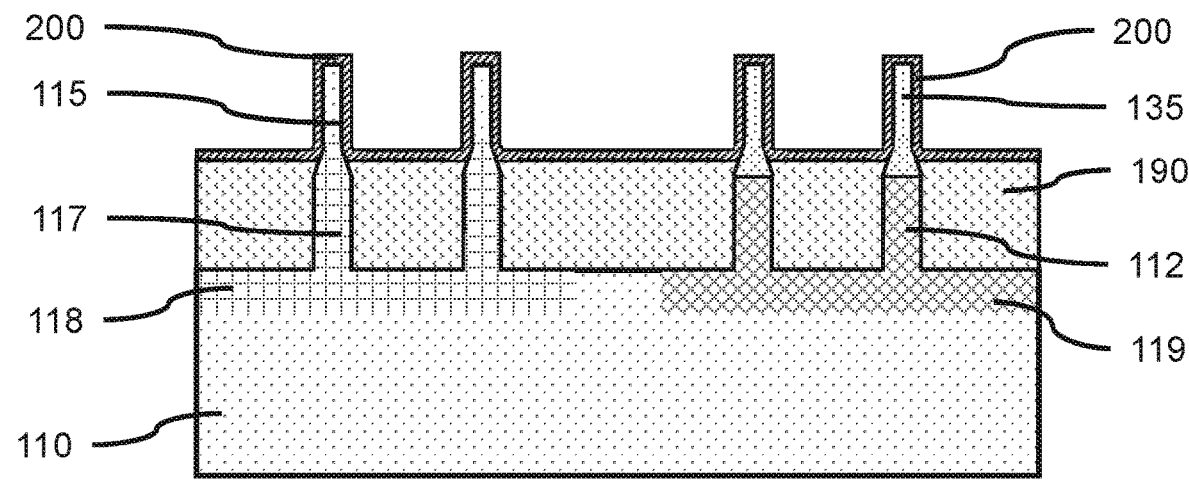
FIG. 18 is a cross-sectional side view showing a gate dielectric layer formed on the in core, pillar core, and filler layer, in accordance with an embodiment of the present invention.

FIG. 18 is a cross-sectional side view showing a gate dielectric layer formed on the in core, pillar core, and filler layer, in accordance with an embodiment of the present invention.

In one or more embodiments, a gate dielectric layer 200 can be formed on the exposed surfaces of the fin core 115, pillar core 135, and top surface of the filler layer 190, where the gate dielectric layer 200 can be blanket (e.g., CVD, PECVD) or conformally (e.g., ALD, PEALD) deposited.

In one or more embodiments, the gate dielectric layer 200 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 200 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one or more embodiments, the gate dielectric layer 200 can have a thickness in the range of about 1 nm to about 4 nm, or can have a thickness in the range of about 1 nm to about 2 nm.

Figure 19:
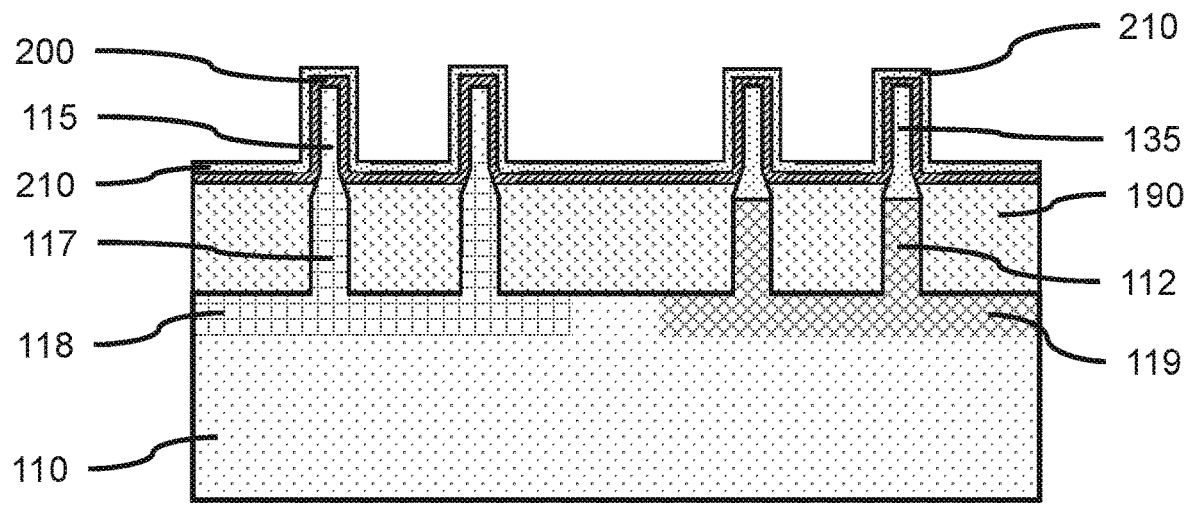
FIG. 19 is a cross-sectional side view showing a work function layer on the gate dielectric layer, in accordance with an embodiment of the present invention.

FIG. 19 is a cross-sectional side view showing a work function layer on the gate dielectric layer, in accordance with an embodiment of the present invention.

In one or more embodiments, a work function layer 210 can be formed on the exposed surfaces of the gate dielectric layer 200, where the work function layer 210 can be conformally deposited by ALD, PEALD, CVD, PECVD, or combinations thereof.

In one or more embodiments, a work function layer 210 can be formed on the gate dielectric layer 200, where the work function layer 210 and gate dielectric layer 200 can surround at least a portion of each of one or more vertical fin(s) 111 as a part of a gate structure. The work function layer 210 can be formed on the gate dielectric layer 200 to adjust the electrical properties of a gate electrode. In various embodiments, the work function layer can be optional. A portion of the work function layer 210 can be formed on the gate dielectric layer 200 on the spacer trough(s) 181 and liner(s) 171. In various embodiments, different work function layers can be formed for the nFETs and pFETs, respectively.

In various embodiments, a work function layer 210 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 210 can include multiple layers of work function materials, for example, a work function layer can be a TiN/TiC stack.

In various embodiments, the work function layer 210 can have a thickness in the range of about 1 nm to about 11 nm, or can have a thickness in the range of about 3 nm to about 5 nm.

Figure 20:
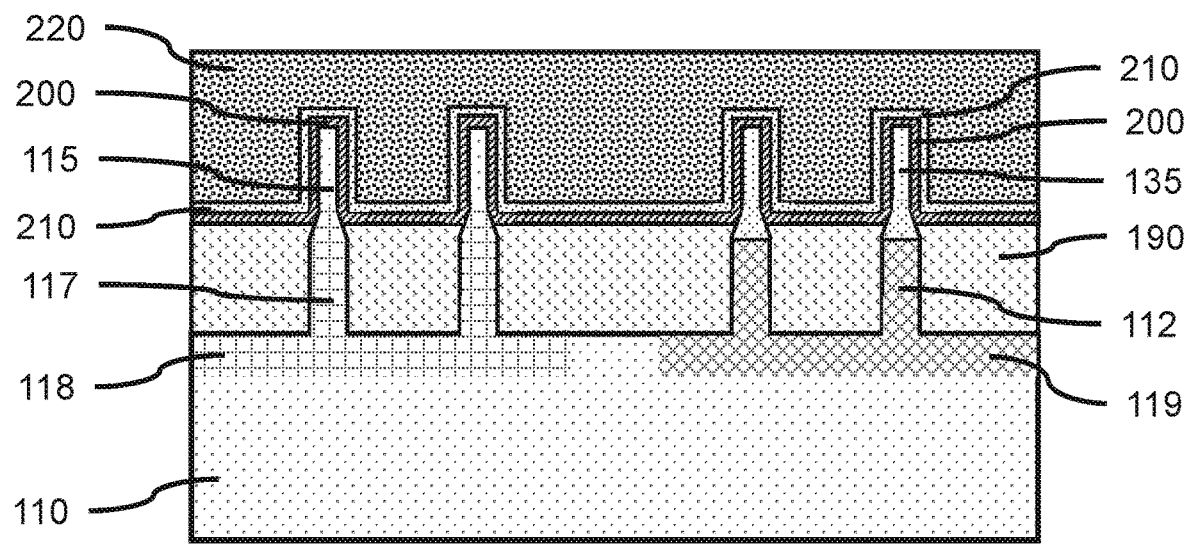
FIG. 20 is a cross-sectional side view showing a gate fill layer on the work function layer, in accordance with an embodiment of the present invention.

FIG. 20 is a cross-sectional side view showing a gate fill layer on the work function layer, in accordance with an embodiment of the present invention.

In one or more embodiments, a gate fill layer 220 can be formed on the gate dielectric layer 200 and/or work function layer 210 if present, where the gate fill layer 220 can fill in the space between vertical fins 111. The gate fill layer 220, gate dielectric layer 200, and optionally the work function layer 210, can form a gate structure on one or more vertical fin(s) 111, where the gate fill layer 220 and work function layer 210 can form a conductive gate electrode.

In various embodiments, the gate fill layer 220 can be doped polycrystalline or amorphous silicon, germanium, silicon-germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In one or more embodiments, the gate fill layer 220 can be blanket deposited, and a chemical-mechanical polishing (CMP) used to remove gate fill layer material that extends above the top surfaces of the gate dielectric layer 200 and/or work function layer 210 if present, where the CMP can provide a smooth, flat surface.

Figure 21:
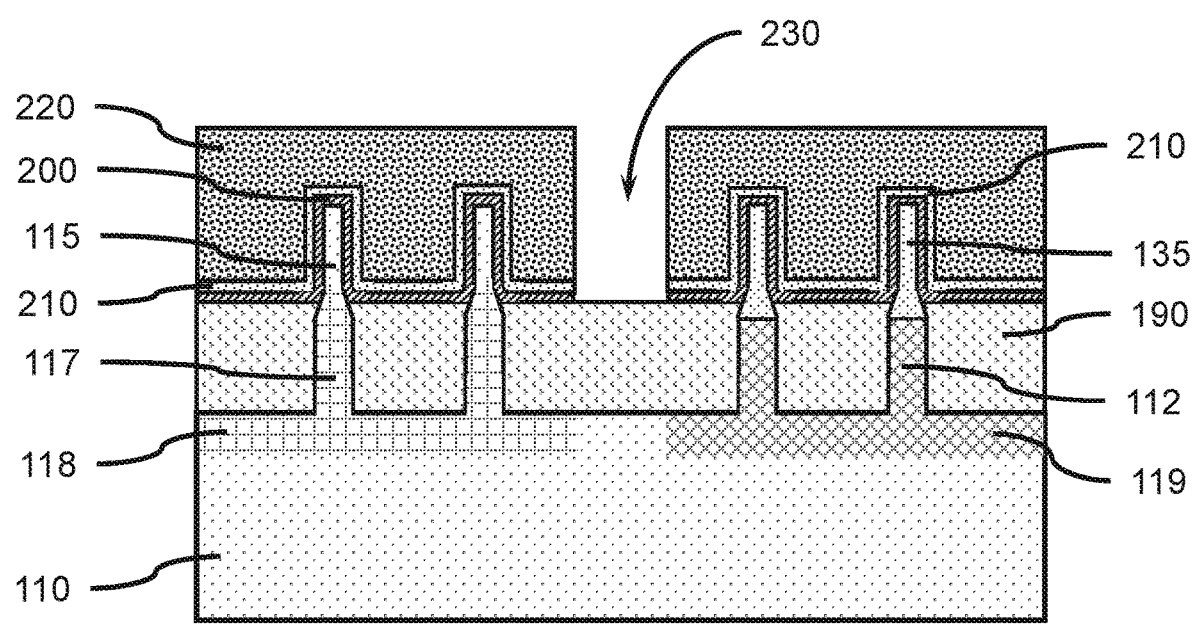
FIG. 21 is a cross-sectional side view showing an isolation trench formed between vertical fins formed on a first region of the substrate and vertical fins formed on a second region of the substrate, in accordance with an embodiment of the present invention.

FIG. 21 is a cross-sectional side view showing an isolation trench formed between vertical fins formed on a first region of the substrate and vertical fins formed on a second region of the substrate, in accordance with an embodiment of the present invention.

In one or more embodiments, the gate fill layer 220 can be masked and an opening formed in the mask. A directional etch can be used to remove a portion of the gate fill layer 220, work function layer 210, and gate dielectric layer 200 to form an isolation trench 230 between vertical fins 111 formed on a first region 101 of the substrate 110 and vertical fins 111 formed on a second region 102 of the substrate 110. The isolation trench 230 can separate a gate structure into two physically and electrically separate gate structures, where one gate structure is on a first region 101 of the substrate 110, and another gate structure is on the second region 102 of the substrate 110. The isolation trench 230 can expose the surface of the filler layer 190.

In one or more embodiments, electrical connections can be formed that electrically connect the vertical fins 111 formed on the first region 101 and vertical fins 111 formed on a second region 102 to form a PFET and an NFET, which may be connected to form a CMOS device. The gate structure can be formed directly on the vertical fins 111, through a so-called 'gate-first' process sequence. Alternatively, a gate structure can be formed by first forming a dummy gate, and later replacing the dummy gate with a real gate structure, through a so-called replacement metal gate process sequence. Other transistor structures such as spacers, source/drains, etc. can be formed after the formation of the real gate or dummy gate.

In one or more embodiments, source/drains can be formed on the vertical fins for HTFETs, or on the vertical fins 111 and in the substrate 110 for VTFETs. Electrical connections can be formed, for example, by via etching and a conductor fill to electrically connect the device components to form the NFETs, PFETs, and CMOS devices. The devices may be suitably packaged and configured to form device chips, electrical circuits, etc.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein s for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the t "below" encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device with vertical fins on a substrate, comprising:
    one or more vertical fins formed on a first region of a substrate, wherein each of the one or more vertical fins formed on the first region of the substrate includes a fin core and a flared fin section made of the same material as the substrate;
    one or more vertical fins formed on a second region of the substrate, where the second region of the substrate is adjacent to the first region of the substrate, and wherein each of the one or more vertical fins formed on the second region of the substrate includes a pillar core and. a flared pillar section made of a different material than the one or more vertical fins formed on the first region of the substrate, wherein each of the one or more pillar cores includes germanium; and
    a filler layer on the substrate, wherein a top surface of the filler layer intersects the flared fin section and the flared pillar section, and wherein the flared pillar sections below the top surface of the filler layer have a germanium concentration gradient.

2. The semiconductor device of claim 1, wherein each of the one or more pillar cores have a germanium concentration in a range of about 20 at. % to about 50 at. %.

3. The semiconductor device of claim 2, wherein each of the one or more fin cores and each of the one or more pillar cores have essentially the same width that is less than the width of a lower fin section below each of the fin cores.

4. The semiconductor device of claim 3, wherein the flared pillar sections have a width in a range of about 15 nanometers (nm) to about 20 nm at an interface with an underlying substrate pillar, and the fin cores and pillar cores each have a width in a range of about 5 nm to about 10 nm.

5. The semiconductor device of claim 4, further comprising, a gate structure on the one or more vertical fins formed on the first region of a substrate, and a gate structure on the one or more vertical fins formed on the second region of the substrate.

6. The semiconductor device of claim 5, further comprising a first punch-through stop (PTS) below each of the pillar cores.

7. The semiconductor device of claim 6, further comprising a second punch-through stop (PTS) below each of the fin cores.

8. The semiconductor device of claim 7, further comprising an isolation trench formed through the gate structure between fin cores on the first region of the substrate and the pillar cores on the second region of the substrate.

9. A semiconductor device with vertical fins on a substrate, comprising:
    one or more vertical fins formed on a first region of a substrate, wherein each of the one or more vertical fins formed on the first region of the substrate includes a fin core, a lower fin section, and a flared fin section between the fin core and the lower fin section, wherein the one or more vertical fins formed on the first region of the substrate are made of the same material as the substrate;
    one or more vertical fins formed on a second region of the substrate, where the second region of the substrate is adjacent to the first region of the substrate, and wherein each of the one or more vertical fins formed on the second region of the substrate includes a pillar core, a substrate pillar, and a flared pillar section between the pillar core and the substrate pillar, wherein the one or more vertical fins formed on the second region of the substrate include different material than the one or more vertical fins formed on the first region of the substrate, and the pillar cores have essentially the same width as the fin cores; and a filler layer on the substrate, wherein a top surface of the filler layer intersects the flared fin section, wherein the flared pillar sections below the top surface of the filler layer have a germanium concentration gradient.

10. The semiconductor device of claim 9, wherein the fin core is silicon, the pillar core is silicon germanium, and the substrate pillar is silicon.

11. The semiconductor device of claim 10, wherein the germanium concentration of the pillar core is in the range of about 10 at. % to about 85 at. %.

12. The semiconductor device of claim 11, wherein the substrate is single crystal silicon.

13. The semiconductor device of claim 9, further comprising a high-K gate dielectric layer directly on the exposed surfaces of the fin cores, pillar cores, and top surface of the filler layer.

14. A semiconductor device with vertical fins on a substrate, comprising:
one or more vertical fins formed on a first region of a substrate, wherein each of the one or more vertical fins formed on a first region of a substrate includes a fin core, a lower fin section, and a flared fin section between the fin core and the lower fin section, wherein the one or more vertical fins formed on the first region of the substrate are made of the same material as the substrate;
one or more vertical fins formed on a second region of the substrate, where the second region of the substrate is adjacent to the first region of the substrate, and wherein each of the one or more vertical fins formed on the second region of the substrate includes a pillar core, a substrate pillar, and a flared pillar section between the pillar core and the substrate pillar, wherein the one or more vertical fins formed on the second region of the substrate include a different material than the one or more vertical fins formed on the first region of the substrate, wherein the one or more fin cores and the one or more pillar cores have essentially the same width;
a filler layer on the substrate, wherein a top surface of the filler layer intersects the flared fin section;
a first punch-through stop (PTS) below each of the pillar cores; and.
a second punch-through stop (PTS) below each of the fin cores.

15. The semiconductor device of claim 14, wherein different dopants are in the flared fin sections and the lower fin sections for the first punch-through stop than in the flared pillar sections and the substrate pillars for the second punch-through stop.

16. The semiconductor device of claim 15, wherein each of the fin cores and each of the pillar cores have a width that is less than the width, $W_1$, of a lower fin section below each of the fin cores.

17. The semiconductor device of claim 16, further comprising, a first gate structure on the one or more fin cores on the first region of a substrate, and a second gate structure on the one or more pillar cores on the second region of the substrate, wherein each of the one or more fin cores are silicon, and each of the one or more pillar cores are silicon-germanium.

18. The semiconductor device of claim 17, wherein the one or more vertical fins and gate structure on the first region of the substrate form a n-type field effect transistor (NFET), the one or more vertical fins and gate structure on the second region of the substrate form a p-type field effect transistor (PFET), and the NFET and PFET are electrically coupled to form a complementary metal oxide semiconductor (CMOS) device.

* * * * *